United States Patent
Tandou et al.

(10) Patent No.: US 8,955,579 B2
(45) Date of Patent: Feb. 17, 2015

(54) PLASMA PROCESSING APPARATUS AND PLASMA PROCESSING METHOD

(75) Inventors: Takumi Tandou, Asaka (JP); Kenetsu Yokogawa, Tsurugashima (JP); Masaru Izawa, Hino (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/091,770

(22) Filed: Apr. 21, 2011

(65) Prior Publication Data

US 2011/0207243 A1 Aug. 25, 2011

Related U.S. Application Data

(63) Continuation of application No. 11/676,593, filed on Feb. 20, 2007, now abandoned.

(30) Foreign Application Priority Data

Jan. 26, 2007 (JP) ................... 2007-016881

(51) Int. Cl.
*F28D 15/00* (2006.01)
*F25D 23/12* (2006.01)
(Continued)

(52) U.S. Cl.
CPC .......... *F25B 39/02* (2013.01); *H01L 21/67109* (2013.01); *F28F 2210/02* (2013.01); *H01J 2237/2001* (2013.01)
USPC .......... 165/104.33; 62/515; 62/524; 62/259.3; 438/540; 438/715; 438/259; 118/724; 118/728

(58) Field of Classification Search
USPC ............... 165/104.33; 118/724, 728
See application file for complete search history.

(56) References Cited

U.S. PATENT DOCUMENTS 2,117,834 A * 5/1938 Wetter ........................ 62/197
5,198,753 A 3/1993 Hamburgen
(Continued)

FOREIGN PATENT DOCUMENTS

JP WO 2004/025199 3/2004
JP 2004-085803 3/2005
(Continued)

*Primary Examiner* — Allen Flanigan
*Assistant Examiner* — Filip Zec
(74) *Attorney, Agent, or Firm* — Antonelli, Terry, Stout & Kraus, LLP.

(57) ABSTRACT

There is provided a means for uniformly controlling the in-plane temperature of a semiconductor wafer at high speed in a high heat input etching process. A refrigerant channel structure in a circular shape is formed in a sample stage. Due to a fact that a heat transfer coefficient of a refrigerant is largely changed from a refrigerant supply port to a refrigerant outlet port, the cross sections of the channel structure is structured so as to be increased from a first channel areas towards a second channel areas in order to make the heat transfer coefficient of the refrigerant constant in the refrigerant channel structure. Thereby, the heat transfer coefficient of the refrigerant is prevented from increasing by reducing the flow rate of the refrigerant at a dry degree area where the heat transfer coefficient of the refrigerant is increased. Further, the cross section of the channel structure is structured so as to be reduced from the second channel areas towards a third channel areas, and thereby the heat transfer coefficient of the refrigerant is prevented from decreasing. Accordingly, the heat transfer coefficient of the refrigerant can be uniformed in the channel structure.

5 Claims, 13 Drawing Sheets

(51) Int. Cl.
*F25B 39/02* (2006.01)
*H01L 21/336* (2006.01)
*H01L 21/24* (2006.01)
*H01L 21/40* (2006.01)
*C23C 16/00* (2006.01)
*H01L 21/67* (2006.01)

(56) References Cited

U.S. PATENT DOCUMENTS

| | | | |
|---|---|---|---|
| 5,567,267 A | 10/1996 | Kazama et al. | |
| 5,802,856 A | 9/1998 | Schaper et al. | |
| 5,846,375 A | 12/1998 | Gilchrist et al. | |
| 5,906,683 A * | 5/1999 | Chen et al. | 118/724 |
| 6,084,215 A | 7/2000 | Furuya et al. | |
| 6,107,608 A | 8/2000 | Hayes | |
| 6,136,163 A | 10/2000 | Cheung et al. | |
| 6,184,504 B1 | 2/2001 | Cardella | |
| 6,359,264 B1 | 3/2002 | Schaper et al. | |
| 6,403,491 B1 | 6/2002 | Liu et al. | |
| 6,639,189 B2 | 10/2003 | Ramanan et al. | |
| 6,668,570 B2 | 12/2003 | Wall et al. | |
| 6,717,113 B2 | 4/2004 | Babikian | |
| 6,748,753 B2 * | 6/2004 | Takano et al. | 62/174 |
| 6,780,374 B2 | 8/2004 | Weaver et al. | |
| 6,993,919 B2 | 2/2006 | Hirooka et al. | |
| 7,017,358 B2 | 3/2006 | Wayburn et al. | |
| 7,601,224 B2 | 10/2009 | Foree | |
| 7,988,062 B2 * | 8/2011 | Nonaka et al. | 236/1 C |
| 2001/0010157 A1 * | 8/2001 | Bascobert | 62/217 |
| 2005/0045104 A1 | 3/2005 | Arai et al. | |
| 2008/0271471 A1 * | 11/2008 | Nozawa et al. | 62/179 |

FOREIGN PATENT DOCUMENTS

| | | |
|---|---|---|
| JP | 2005-085802 | 3/2005 |
| JP | 2005-089864 | 4/2005 |
| JP | 2006-005374 | 1/2006 |
| WO | WO 99/41778 | 8/1999 |

* cited by examiner

PLASMA PROCESSING APPARATUS AND PLASMA PROCESSING METHOD

CLAIM OF PRIORITY

The present invention application claims priority from Japanese application JP2007-16881 filed on Jan. 26, 2007, the content of which is hereby incorporated by reference into this application. This application is a Continuation application of application Ser. No. 11/676,593, filed Feb. 20, 2007 now abandoned, the contents of which are incorporated herein by reference in their entirety.

FIELD OF THE INVENTION

The present invention relates to a plasma processing apparatus and a plasma processing method in which a microfabrication process is performed on a sample such as a wafer in a semiconductor manufacturing process, and particularly to a temperature control apparatus and a temperature control method for an electrode portion by which a semiconductor wafer is held and fixed.

BACKGROUND OF THE INVENTION

Along with microfabrication of a semiconductor device, processing accuracy required for an etching process of a sample has been increasingly strict. In order to perform a high accuracy process on a micropattern of a wafer surface with a plasma processing apparatus, it is important to control the temperature of the wafer surface during an etching process. However, due to the demand for a larger area of a wafer and the improvement of an etching rate, high frequency electric power applied to the plasma processing apparatus tends to be increased, and large electric power in kilowatt-order has been beginning to be applied, in particular, for etching of an insulating film. The applying of large electric power increases ion impact energy to the wafer surface, which involves a problem of an excessive rise of the temperature of the wafer during an etching process. Further, due to the demand for further improvement of shape accuracy, a means capable of controlling the temperature of the wafer at high speed and with accuracy during the process has been demanded.

In order to control the surface temperature of the wafer in a plasma processing apparatus, it is necessary to control the surface temperature of an electrostatic absorption electrode (hereinbelow, referred to as an electrode) which comes in contact with the back surface of the wafer through a heat transfer medium. For a conventional electrode, channels for a refrigerant are formed inside the electrode, and a liquid refrigerant is allowed to flow inside the channels so as to control the temperature of an electrode surface. The liquid refrigerant is supplied to refrigerant channels inside the electrode after being adjusted to a target temperature by a cooling apparatus or a heating apparatus inside a refrigerant supply apparatus. Such a refrigerant supply apparatus has a structure in which the liquid refrigerant is once stored in a tank and is fed after adjusting its temperature, and is effective in keeping the surface temperature of the wafer constant because the liquid refrigerant itself exhibits a large heat capacity. However, the liquid refrigerant is poor in temperature response, low in heat exchange efficiency, and the temperature thereof is difficult to control at high speed. Therefore, the refrigerant supply apparatus becomes larger in size along with a recent high-heat-input, and it has been difficult to optimally control the temperature of the wafer surface in accordance with the progression of etching.

For the problems described above, there has been proposed a direct-expansion-system refrigerant supply apparatus (hereinbelow, referred to as a direct-expansion-system refrigeration cycle) in Japanese Patent Application Laid-Open No. 2005-89864 in which a compressor for allowing the pressure of a refrigerant to be higher with a refrigerant circulation system, a condenser for condensing the high-pressured refrigerant, and an expansion valve for expanding the refrigerant are installed in an electrode, and the refrigerant is evaporated inside refrigerant channels of the electrode for cooling.

In the direct-expansion-system refrigeration cycle, since latent heat generated by refrigerant evaporation is utilized, the cooling efficiency is high, and further it is possible to control the evaporation temperature of the refrigerant by pressure at high speed. For the reason as described above, by employing the direct-expansion-system refrigeration cycle as a refrigerant supply apparatus for an electrode, the temperature of the semiconductor wafer at the time of a high heat input etching process can be controlled with high efficiency and at high speed.

The direct-expansion-system refrigeration cycle performs cooling by using latent heat generated when the refrigerant evaporates from a liquid state to a gaseous state, and the evaporation temperature of the refrigerant can be controlled by pressure. In the refrigerant channels of the electrode, if the refrigerant pressure is constant, the evaporation temperature is constant. However, the refrigerant flows while being evaporated by absorbing heat in the channels, and thus a heat transfer coefficient is changed along with the phase change. That is, even when the refrigerant pressure is kept constant in the refrigerant channels in consideration of uniformity of the in-plane temperature of the electrode, the heat transfer coefficient becomes nonuniform in the refrigerant channels, and thus it is difficult to uniformly control the surface temperature of the electrode, and further the in-plane temperature of the wafer. For that reason, when the direct-expansion-system refrigeration cycle is employed as a cooling mechanism for an electrode, the uniform control of in-plane temperature distribution is a technical challenge.

For the above described problems, Japanese Patent Application Laid-Open No. 2005-89864 proposes a method in which by using a heat diffusion plate for an electrode surface on which the wafer is placed, the nonuniform heat transfer of the refrigerant is corrected so that the in-plane temperature of the wafer is made uniform. Thereby, even if the direct-expansion-system refrigeration cycle is employed as a cooling mechanism for an electrode, the in-plane temperature of the wafer can be uniformly controlled with high cooling efficiency. However, in the case where the temperature of the wafer is controlled at high speed hereafter, it is necessary to reduce the heat capacity of the electrode. Even if the evaporation temperature of the refrigerant can be varied at high speed, the large heat capacity results in lowering of the speed of the temperature control for the wafer.

SUMMARY OF THE INVENTION

In order to reduce the heat capacity of the electrode, it is necessary to reduce the mass of constituent elements. However, when the heat diffusion plate is used, a proper thickness is required for the plate in order to secure a heat diffusion area. Further, due to a recent high-heat-input caused by applying a high wafer bias, a difference in in-plane temperature becomes large, and a thickness required for the heat diffusion plate is increased.

Due to this, a new study on an electrode structure has been needed in order to uniformly control the in-plane temperature of the wafer on the electrode with high efficiency and at high speed by using the direct-expansion-system refrigeration cycle.

An object of the present invention is to provide a plasma processing apparatus and a plasma processing method in which the in-plane temperature of a sample to be processed can be uniformly controlled with high cooling efficiency, and at the same time, the heat capacity of en electrode can be reduced.

Another object of the present invention is to provide a plasma processing apparatus and a plasma processing method in which by restraining a heat transfer coefficient α of a refrigerant in the in-plane of an electrode of a sample stage, the in-plane temperature of a sample to be processed can be uniformly controlled with high efficiency and at high speed.

Still another object of the present invention is to provide a plasma processing apparatus and a plasma processing method in which by controlling a heat transfer coefficient α of a refrigerant in the in-plane of an electrode of a sample stage, the in-plane temperature distribution of a sample to be processed can be arbitrarily controlled.

In order to address the above described problems, according to the present invention, there is provided a plasma processing apparatus which converts a process gas introduced inside a vacuum processing chamber into plasma and which performs surface processing, by using the plasma, on a sample that is placed on an electrostatic absorption electrode of a sample stage, the apparatus comprising: a refrigerant channel structure which is provided in the sample stage under the electrostatic absorption electrode, wherein the refrigerant channel structure configures an evaporator of a refrigeration cycle; and a refrigerant supply port and a refrigerant outlet port which supplies and evacuates a refrigerant for cooling to/from the refrigerant channel structure, wherein the refrigerant channel structure of the sample stage is formed between the refrigerant supply port and the refrigerant outlet port and have at least three channel areas that are sequentially connected to each other from the side of the refrigerant supply port to the side of the refrigerant outlet port, and the cross section of the middle channel area among at least three channel areas is larger than those of the other channel areas.

Further, the plasma processing apparatus according to the present invention, irregularities are formed on inner walls of at least three channel areas in the refrigerant channel structure, and the heights of the irregularities of the middle channel area among at least three channel areas are lower than those of the other channel areas.

Furthermore, in the present invention, a plasma processing apparatus which converts a material gas that is introduced inside a vacuum vessel having a vacuum evacuation means by a gas introduction means, into plasma and which performs surface processing, by using the plasma, on a sample to be processed, further comprising a sample stage on which the sample is placed is a sample stage, a refrigeration cycle including a compressor, a condenser and an expansion valve is configured with the sample stage as an evaporator, a means which supplies and evacuates a refrigerant for cooling to/from the sample stage is provided, and the in-plane temperature distribution of the sample to be processed is arbitrarily controlled by adjusting the dry degree of the refrigerant that flows in the sample stage.

According to the present invention, the cross sections of refrigerant channel structure in a sample stage is changed in accordance with changes of a heat transfer coefficient accompanied by phase change of a refrigerant, and accordingly it is possible to uniformly maintain the in-plane temperature of the electrode by controlling the flow rate of the refrigerant and by reducing the non-uniformity of the heat transfer coefficient in the channels. Further, it is possible to arbitrarily control the in-plane temperature distribution of a wafer on the electrode by controlling the dry degree, flow volume and pressure of the refrigerant that flows inside the refrigerant channel structure of the electrode.

Moreover, the present invention can provide a temperature adjusting unit for an electrode by which the in-plane temperature of a wafer at the time of etching with a high heat input caused by applying high wafer bias electric power can be uniformly controlled with high efficiency and at high speed.

BRIEF DESCRIPTION OF THE DRAWINGS

The invention will be more particularly described with reference to the accompanying drawings, in which.

DETAILED DESCRIPTION OF THE PREFERRED EMBODIMENTS

Preferred embodiments of the present invention will be described hereinbelow.

[First Embodiment]

A first embodiment of the present invention will be described with reference to FIGS. 1 to 4.

Figure 1:
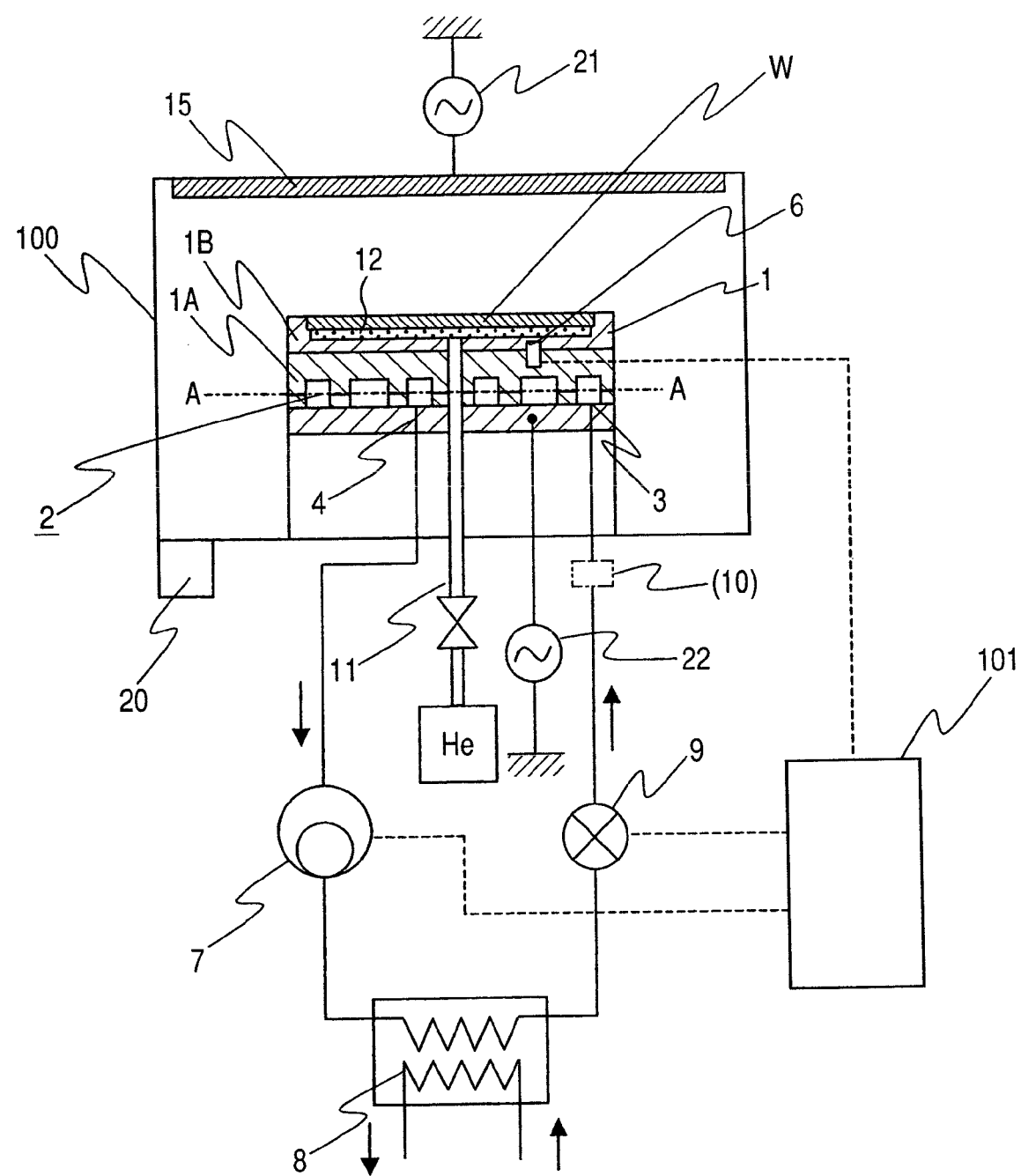
FIG. 1 is a schematic diagram showing the whole system configuration of a plasma processing apparatus according to the present invention.

FIG. 1 is a schematic diagram showing the whole system configuration of a plasma processing apparatus that is an embodiment of the present invention. The plasma processing apparatus includes a processing chamber 100 arranged in a vacuum vessel, and a sample stage 1 having an electrostatic absorption electrode is arranged inside the processing chamber 100. The processing chamber 100 is connected to a vacuum evacuation apparatus 20 such as a vacuum pump for evacuating the inside of the processing chamber 100 for pressure reduction. An electrode plate 15 is provided on an upper portion of the processing chamber 100, and an antenna power source 21 is connected to the electrode plate 15. A gas introduction means such as a shower plate (not shown) for supplying a process gas is provided on an upper portion of the processing chamber 100.

The sample stage 1 includes a base material portion 1A and a lower electrode (electrostatic absorption electrode) 1B. In the base material portion 1A, there are provided a refrigerant channel structure 2 in which a refrigerant circulates. The lower electrode 1B is provided with a dielectric film for electrostatic absorption, and an upper surface of the electrode is configured as a sample placement surface on which a substrate (wafer) W to be processed is placed. He gas 12 for heat transfer is supplied from a heat transfer gas supply system 11 to a micro clearance formed between an upper surface of the sample placement surface of the sample stage 1 and a back surface of the wafer. A bias power source 22 and a DC power source (not shown) for electrostatic absorption are connected to the sample stage 1.

The refrigerant channel structure 2 provided in the base material portion 1A of the sample stage 1 is connected to a refrigerant supply port 3 and a refrigerant outlet port 4. The refrigerant channel structure 2 configure a refrigeration cycle, together with a compressor 7, a condenser 8, an expansion valve 9.

The refrigerant channel structure 2 provided in the sample stage 1 configures an evaporator of a direct-expansion-system refrigeration cycle. That is, latent heat (heat of evaporation) generated when the refrigerant evaporates in the refrigerant channel structure 2 of the sample stage 1 allows the sample stage 1 in contact with the refrigerant to be cooled. According to the present invention, usually, the refrigerant channel structure 2 achieves the function of an evaporator of a refrigeration cycle. However, in a modified embodiment of the present invention described later, a dry degree adjusting means (a first refrigerant evaporator) 10 is installed between the refrigerant channel structure 2 (a second refrigerant evaporator) 2 in the sample stage 1 and the expansion valve 9 to adjust the dry degree of the refrigerant supplied to the refrigerant channel structure 2. As a refrigerant, for example, R410 (hydrofluorocarbon) is used.

The reference numeral 6 denotes temperature sensors provided at plural locations while being closer to the sample placement surface. The reference numeral 101 denotes a temperature control system, which controls the compressor 7 and the expansion valve 9 in response to an output from the temperature sensor 6 and thus controls the temperature of the substrate (wafer) W to be processed on the sample placement surface to reach a target value. The temperature of the wafer W is changed depending on a process condition such as plasma etching, that is, a heat input condition from plasma to the wafer W. Therefore, the flow volume of the refrigerant that flows in the refrigerant channel structure 2, a refrigerant pressure (refrigerant evaporation temperature) and the like are controlled based on a temperature detected by the temperature sensor 6, so that the temperature of the wafer W is controlled to be kept at a target value.

Figure 2:
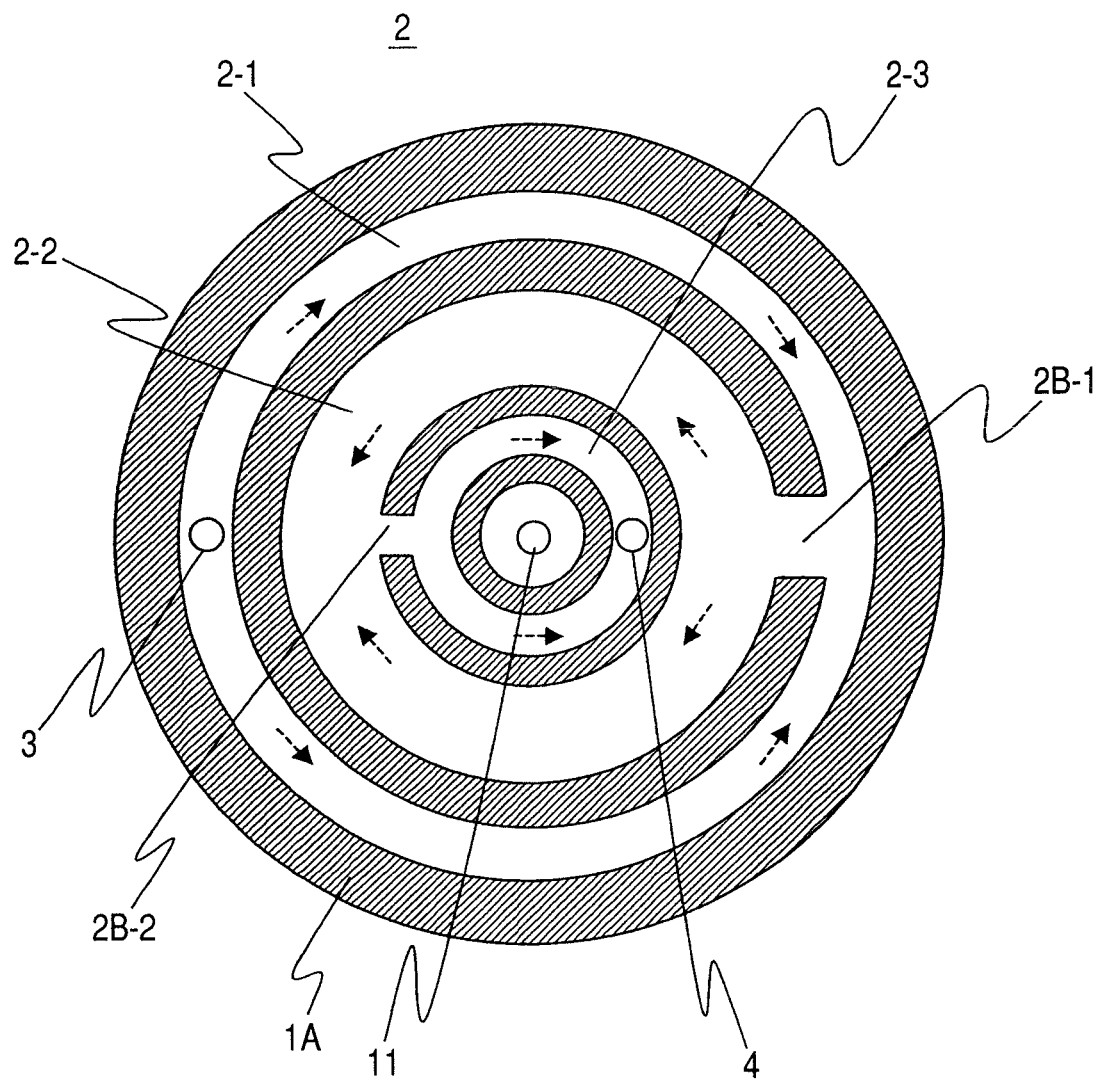
FIG. 2 is a schematic diagram showing a first embodiment of a channel configuration of a refrigerant channel structure in a sample stage according to the present invention.

In the present invention, the refrigerant channel structure 2 configuring an evaporator has at least three channel areas between the refrigerant supply port 3 and the refrigerant outlet port 4, and are configured in such a manner that the cross section of the middle channel area among these channel areas is larger than those of the other channel areas. This configuration will be described with reference to FIG. 2. FIG. 2 shows a cross section taken along the line A-A in FIG. 1.

In FIG. 2, the refrigerant channel structure 2 having three channel areas in a concentric circular shape is formed at a position with the same height as the base material portion 1A. The refrigerant channel structure 2 includes a first circular channel 2-1 located outer region that is connected to the refrigerant supply port 3 and is branched into the left and right directions, a second circular channel 2-2 located middle region that is branched into the left and right directions through a first linkage channel 2B-1, and a third circular channel 2-3 located inner region that is branched into the left and right directions through a second linkage channel 2B-2. The third channel 2-3 is connected to the refrigerant outlet port 4.

The refrigerant flows inside the refrigerant channel structure 2 from the refrigerant supply port 3 in a liquid state, cools the sample stage 1 with evaporation latent heat, and flows out of the refrigerant outlet port 4 in a gaseous state. A heat transfer coefficient $\alpha$ of a refrigerant is largely changed from the refrigerant supply port 3 towards the refrigerant outlet port 4. Therefore, in order to make the heat transfer coefficient $\alpha$ of the refrigerant constant in the channel structure 2, the cross sections of three regions of the channel structure 2 are structured so as to be increased from the first channel 2-1 towards the second channel 2-2.

Thus, the flow rate of the refrigerant is lowered at a dry degree area where the heat transfer coefficient of the refrigerant increases, so that the heat transfer coefficient of the refrigerant is prevented from increasing. Further, the cross sections of the plural regions of the refrigerant channel structure 2 are structured so as to be reduced from the second channel 2-2 towards the third channel 2-3, and accordingly the heat transfer coefficient of the refrigerant is prevented from decreasing.

Here, there will be described a relation between the cross sections of the plural regions of the refrigerant channel structure that is a feature of the present invention, and a refrigerant dry degree (X) and a heat transfer coefficient $\alpha$, by using FIGS. 3A, 3B, 4A, and 4B.

Figure 3A:
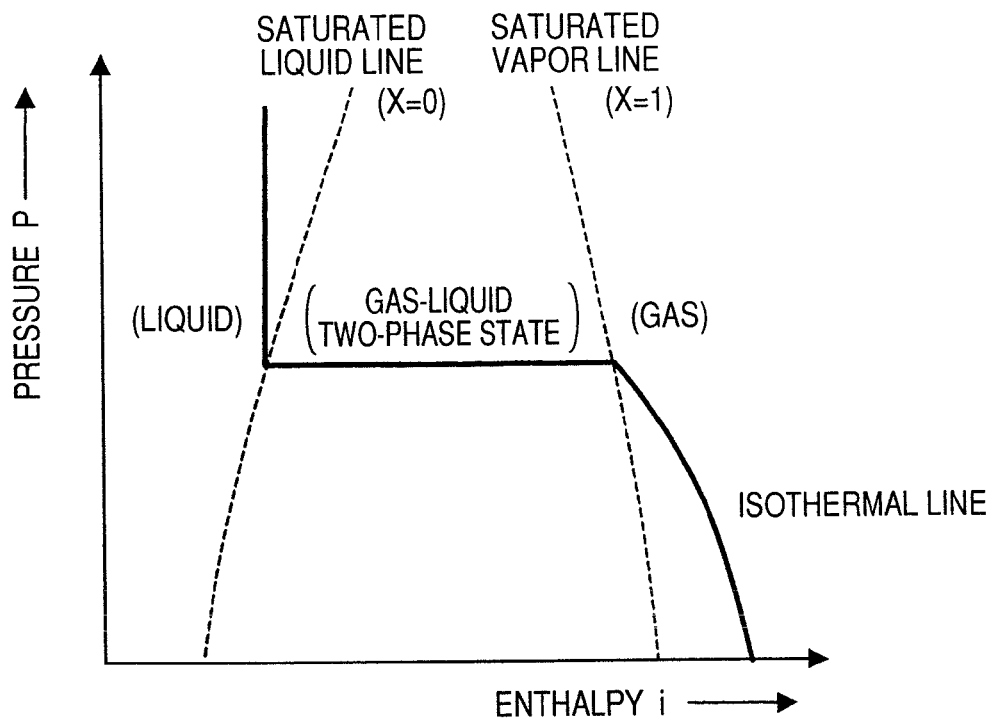
FIG. 3A is a graph showing a typical characteristic of a refrigerant in a refrigeration cycle employed in the present invention.

FIG. 3A is a graph showing a typical characteristic of a refrigerant in the refrigeration cycle employed in the first embodiment. The first embodiment is configured in such a manner that latent heat (heat of evaporation) generated when the refrigerant evaporates in the refrigerant channel structure 2 inside the sample stage 1 allows the sample stage 1 in contact with the refrigerant to be cooled. Inside the refrigerant channel structure 2 in which the heat exchange (evaporation) of the refrigerant occurs, the refrigerant is in a gas-liquid two-phase state (the dry degree X=0 to 1), and the evaporation temperature (hereinbelow, referred to as temperature) TE of the refrigerant is constant in a theoretical sense as long as the pressure P of the refrigerant is constant under the state. On the other hand, the temperature TE of the refrigerant basically becomes higher as the pressure P of the refrigerant is increased, as shown in FIG. 3B.

In the present invention, in addition to an ordinary temperature adjusting mechanism in which the pressure P of the refrigerant and the rotational speed of the compressor 7 are controlled to adjust the flow volume Q of the refrigerant, the dry degree X of the refrigerant between the refrigerant supply port 3 and the refrigerant outlet port 4 of the refrigerant channel structure 2 is controlled so as to control the sample placement surface of the sample stage at a predetermined temperature.

Figure 4A:
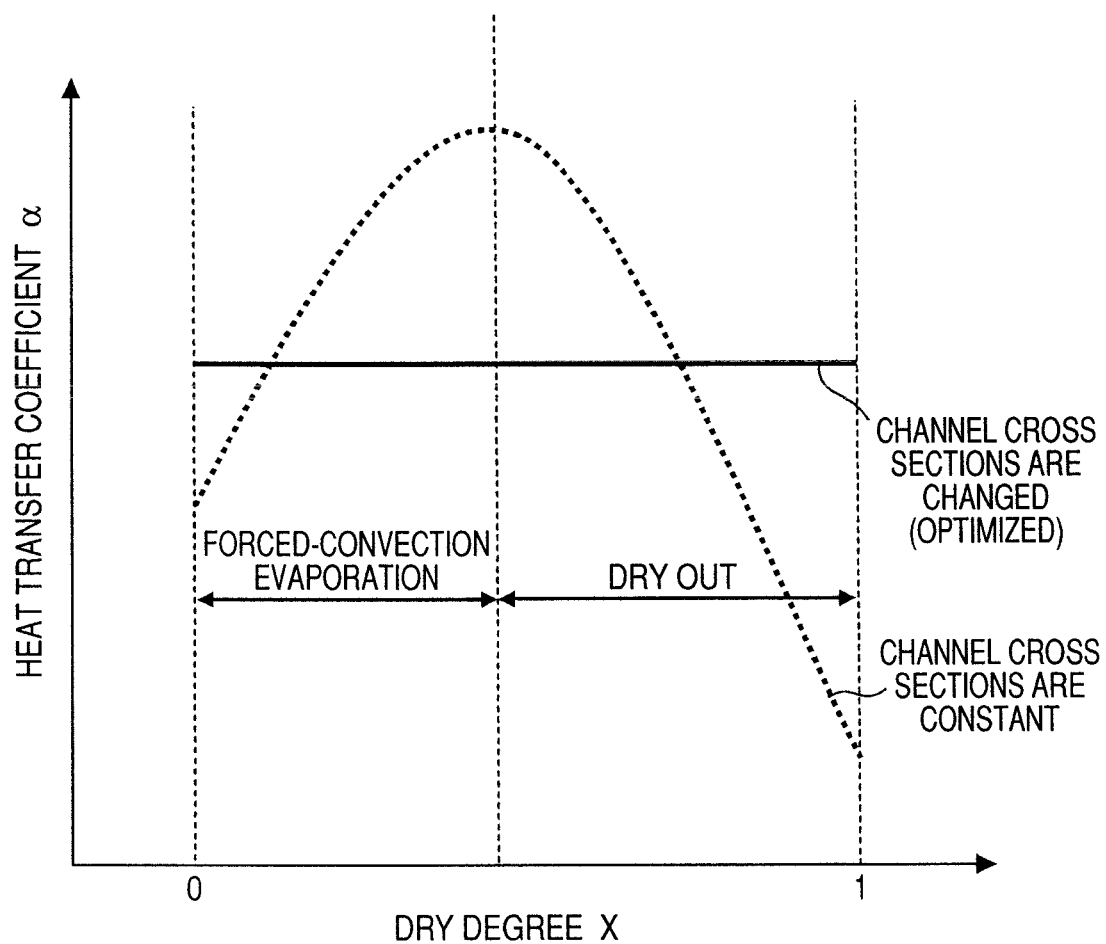
FIG. 4A is an explanation diagram showing a typical characteristic of a heat transfer coefficient of the refrigerant.

FIG. 4A shows a characteristic of the refrigerant heat transfer coefficient in the direct-expansion-system refrigeration cycle. In the direct-expansion-system refrigeration cycle, cooling is performed using latent heat generated when the refrigerant evaporates into a gaseous state from a liquid state, and the evaporation temperature of the refrigerant can be controlled by pressure.

Figure 3B:
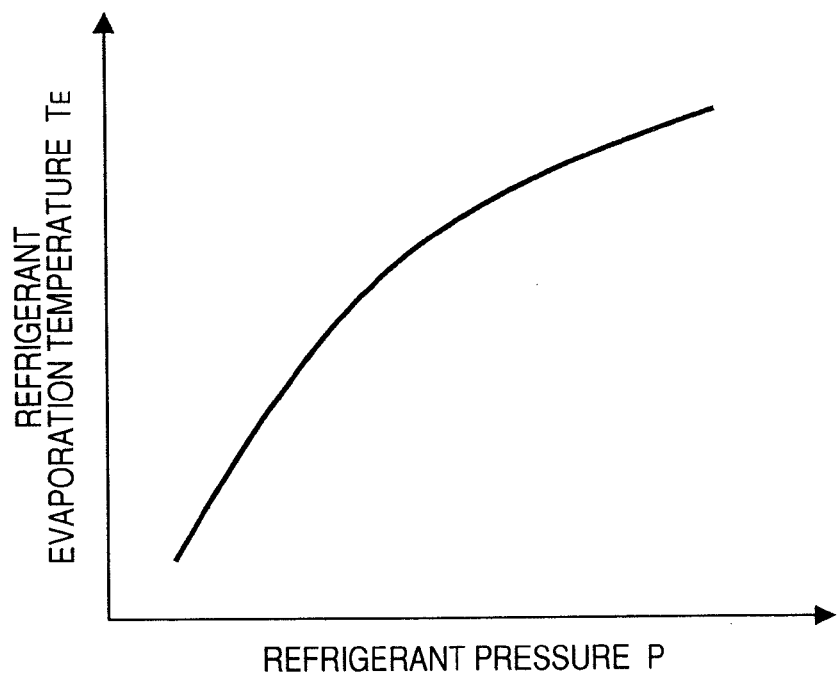
FIG. 3B is an explanation diagram showing a typical characteristic of the evaporation temperature of the refrigerant.

As described in FIG. 3B, even when a ratio of liquid to gas (dry degree X) of the refrigerant is changed, the evaporation temperature TE remains unchanged as long as the pressure P is constant.

However, when the evaporation of the refrigerant makes progress and thus the dry degree X is changed, the heat transfer coefficient α is accordingly changed as shown in FIG. 4A. The graph of "channel cross sections are constant" represented by the dotted line in FIG. 4A shows a relation between the dry degree X and the heat transfer coefficient α in a conventional, typical channel configuration, that is, in the case where the channel cross sections are constant between the refrigerant supply port 3 and the refrigerant outlet port 4 of the refrigerant channel structure 2. In the direct-expansion-system refrigeration cycle, the heat transfer mode of the refrigerant is changed from forced-convection evaporation to dry out in a process of the phase change from a liquid state to a gaseous state. The forced-convection evaporation starts from an initial stage of refrigerant evaporation, and then the heat transfer coefficient α increases along with the increase of the dry degree X. When the dry degree X of the refrigerant becomes constant, the dry out (disappearance of liquid films) occurs to lower the heat transfer coefficient α. As described above, the heat transfer coefficient α of the refrigerant is largely changed depending on the dry degree X of the refrigerant in the direct-expansion-system refrigeration cycle. Therefore, in the case where the direct-expansion-system refrigeration cycle is employed as a cooling mechanism for wafers, the control of in-plane temperature distribution of the wafer to be processed is a technical challenge.

For example, in the case where the flow volume of the refrigerant is set at 7.5m³/s by using R410 as a refrigerant and ¼ inches tubes (inner diameter: 4.8 mm and no irregularities of inner walls) as a refrigerant channel structure, the maximum value of the heat transfer coefficient reaches approximately 4200W/m²K (at a dry degree of approximately 0.5), and is lowered down to approximately 500W/m²K (at a dry degree of approximately 0.99) immediately before completion of the evaporation. As described above, since the heat transfer coefficient α of the refrigerant in a liquid phase is changed to about 9 times that in a gaseous phase in the direct-expansion-system refrigeration cycle, it is impossible to uniformly control the in-plane temperature of the wafer unless the fact is considered.

As described above, in the invention, the channel cross sections between the refrigerant supply port 3 and the refrigerant outlet port 4 of the refrigerant channel structure 2 provided in the base material portion 1A are changed in such a manner that the cross section of the middle channel area is changed to be larger than those of the other preceding and succeeding channel areas in accordance with the changes of the heat transfer coefficient α accompanied by the phase change of the refrigerant.

As described above, the present invention is characterized in that the channel cross sections are changed in accordance with the dry degree of the refrigerant between the refrigerant supply port 3 and the refrigerant outlet port 4 of the refrigerant channel structure 2 based on a characteristic that gives a relation between the dry degree and the heat transfer coefficient α of the refrigerant, so that the heat transfer coefficient α of the refrigerant in the sample stage 1 becomes a desired one in the in-plane corresponding to the sample placement surface. Specifically, the heat transfer coefficient α of the refrigerant is lowered by increasing the channel cross section and by decreasing the flow rate of the refrigerant at a point (dry degree X=approximately 0.5) where the heat transfer coefficient α of the refrigerant becomes large in a typical characteristic in which the channel cross sections are constant as shown in FIG. 4A. On the contrary, the heat transfer coefficient α of the refrigerant is increased by decreasing the channel cross sections and by increasing the flow rate of the refrigerant at a point (dry degree X=approximately 0) where the dry degree is low or at a point (dry degree X=approximately 1) where the dry degree is high. In such a manner, a characteristic of the heat transfer coefficient α in the whole in-plane corresponding to the sample placement surface of the sample stage 1, that is, between the refrigerant supply port 3 and the refrigerant outlet port 4 of the refrigerant channel structure 2 can be made flat.

Figure 4B:
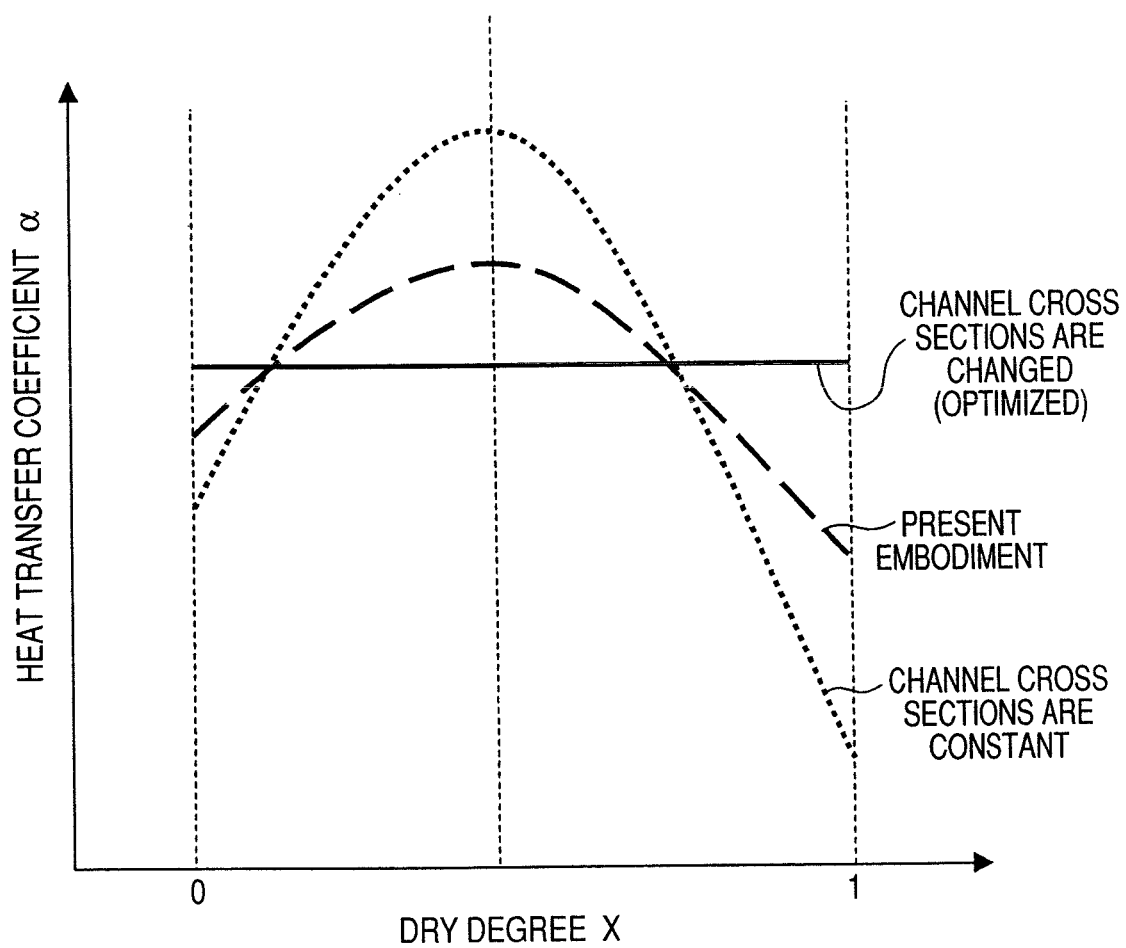
FIG. 4B is an explanation diagram showing a characteristic of the heat transfer coefficient of the refrigerant in the first embodiment according to the present invention.

With such a perspective, the heat transfer coefficient α of the refrigerant can be constant as shown by the solid line in FIG. 4B irrespective of the value of the dry degree X of the refrigerant in an ideal condition (namely, the channel cross sections are optimized) in which the channel cross sections of the refrigerant channel structure are changed in a continuous manner so that one of the channel cross sections of the refrigerant channel structure 2 becomes maximum at a point where the heat transfer coefficient α of the refrigerant becomes maximum.

In consideration of easy workability of channel grooves, even in the case where the channel cross sections of the refrigerant channel structure 2 are changed stepwise in such a manner that the cross section of the middle channel area among the channel areas between the refrigerant supply port 3 and the refrigerant outlet port 4 of the refrigerant channel structure 2 becomes larger than those of the other channel areas, a characteristic of the heat transfer coefficient of the refrigerant in the channels can be made nearly flat irrespective of the value of the dry degree of the refrigerant.

For example, as shown in the embodiment of FIG. 2, in the case where the cross sections of the refrigerant channel structure are changed in three steps, the heat transfer coefficient α of the refrigerant is changed in accordance with the value of the dry degree X of the refrigerant as shown by the dotted line in FIG. 4B. However, the amount of changes is one-half or less compared to the case in which the channel cross sections are constant.

As described above, by employing the configuration in which one of the cross sections of the refrigerant channel structure provided in the base material portion 1A becomes larger in mid-course than those around the refrigerant supply port 3 and the refrigerant outlet port 4, the heat transfer coefficient of the refrigerant can be made uniform in the refrigerant channel structure 2.

Specifically, by employing the channel structure in which at least three or more channel areas are provided in the channel structure 2 and the cross section of the middle channel area among the channel areas is larger than those of the other channel areas, the heat transfer coefficient of the refrigerant is made substantially constant in the refrigerant channel structure 2 irrespective of the value of the dry degree of the refrigerant.

It should be noted that even in the gas-liquid two-phase flow of the direct-expansion-system refrigeration cycle, when the flow volume of the refrigerant is increased, the heat transfer coefficient α is improved along with the increase of the flow rate, as similar to an ordinary liquid.

In the case where the cross sections A (A1, A2, A3) of the refrigerant channel structure 2 are changed in three steps as shown in the embodiment of FIG. 2, the cross section A3 of the third channel≤the cross section A1 of the first channel<the cross section A2 of the second channel is advantageous. It should be noted that two linkage channels 2B (2B-1, 2B-2) for connecting between the respective channels are necessary in the refrigerant channel structure 2. It is advantageous that as arrangement positions of the linkage channels 2B, the linkage channels 2B are arranged at opposed positions across the center of the lower electrode 1B in consideration of even influx of the refrigerant inside the refrigerant channel structure 2. Further, it is desirable that the cross section of the linkage channel 2B-1 is the same as, or larger than the cross section A2 of the first channel 2-1. Furthermore, it is desirable that the cross section of the linkage channel 2B-2 is the same as, or larger than the cross section A3 of the third channel 2-3.

Next, there will be given a brief explanation of procedures in the case of performing an etching process for the wafer W with the apparatus in FIG. 1. First, the wafer W is carried in the processing chamber 100 by a wafer transferring apparatus from a cassette (not shown), placed on the sample placement surface of the sample stage 1, and fixed by electrostatic absorption. Then, a process gas necessary for etching the wafer W is supplied via a gas line (not shown), and the processing chamber 100 is adjusted to a predetermined processing pressure by the vacuum evacuation apparatus 20. Next, plasma is generated by power source supply from the antenna power source 21 and the bias power source 22 and by the act of a magnetic field forming means (not shown), and an etching process using the plasma is started. A wafer temperature during the process is feedback-controlled by the temperature control system 101 while monitoring temperature information from the temperature sensors 6, and the compressor 7 and the expansion valve 9 are adjusted so as to adjust the flow volume and evaporation temperature of the refrigerant. At this time, since the refrigerant channel structure 2 in the sample stage 1 has a structure in which the channel cross sections are changed in accordance with the changes of the heat transfer coefficient of the refrigerant as shown in FIG. 2, the in-plane distribution of cooling capability caused by the phase change of the refrigerant is reduced and the in-plane temperature of the sample placement surface of the sample stage 1 can be uniformly controlled at high speed.

[Second Embodiment]

Figure 5:
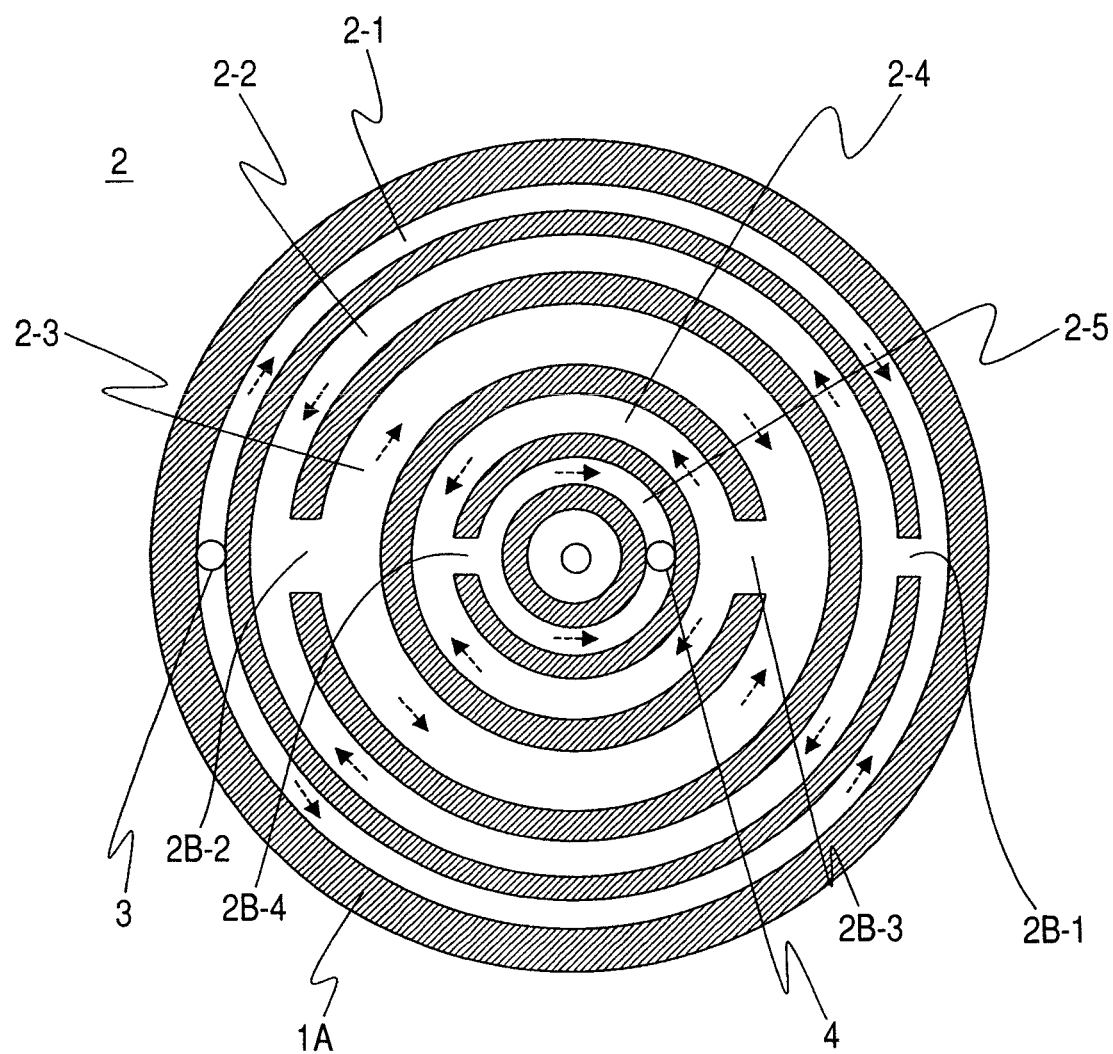
FIG. 5 is a schematic diagram showing a second example of the channel configuration in the sample stage according to the present invention.

It should be noted that in the case where the temperature distribution of the sample stage 1 is uniformly controlled with more accuracy, it is advantageous that the refrigerant channel structure 2 is diversified. As a second embodiment of the present invention, an example in which the refrigerant channel structure is diversified (changed in five steps) is shown in FIG. 5. The refrigerant channel structure 2 includes five channel portions; a first channel 2-1 that is connected to the refrigerant supply port 3 and is branched into the left and right directions, a second channel 2-2 that is branched into the left and right directions through a first linkage channel 2B-1, a third channel 2-3 that is branched into the left and right directions through a second linkage channel 2B-2, a fourth channel 2-4 that is branched into the left and right directions through a third linkage channel 2B-3, and a fifth channel 2-5 that is branched into the left and right directions through a fourth linkage channel 2B-4, and the fifth channel 2-5 is connected to the refrigerant outlet port 4.

In this case, too, by employing the structure in which one of the cross sections of the refrigerant channel structure 2 becomes maximum at a point (assumed as third linkage channel 2B-3 in this case) where the heat transfer coefficient α of the refrigerant becomes maximum, a characteristic similar to the flat (optimized) characteristic shown by the solid line in FIG. 4B can be obtained. Accordingly, the in-plane temperature of the wafer on the sample stage 1 can be easily controlled.

[Third Embodiment]

In the examples shown in FIGS. 2 and 5, the placement positions of the refrigerant supply port 3 and the refrigerant outlet port 4 may be opposite. However, in this case, to take FIG. 2 as an example, the relation between the cross sections A (A1, A2, A3) of the first channel 2-1 and that of the third channel 2-3 needs to be opposite, and the relation between the cross section of the linkage channel 2B-1 and that of the linkage channel 2B-2 needs to be also opposite.

[Fourth Embodiment]

Figure 6:
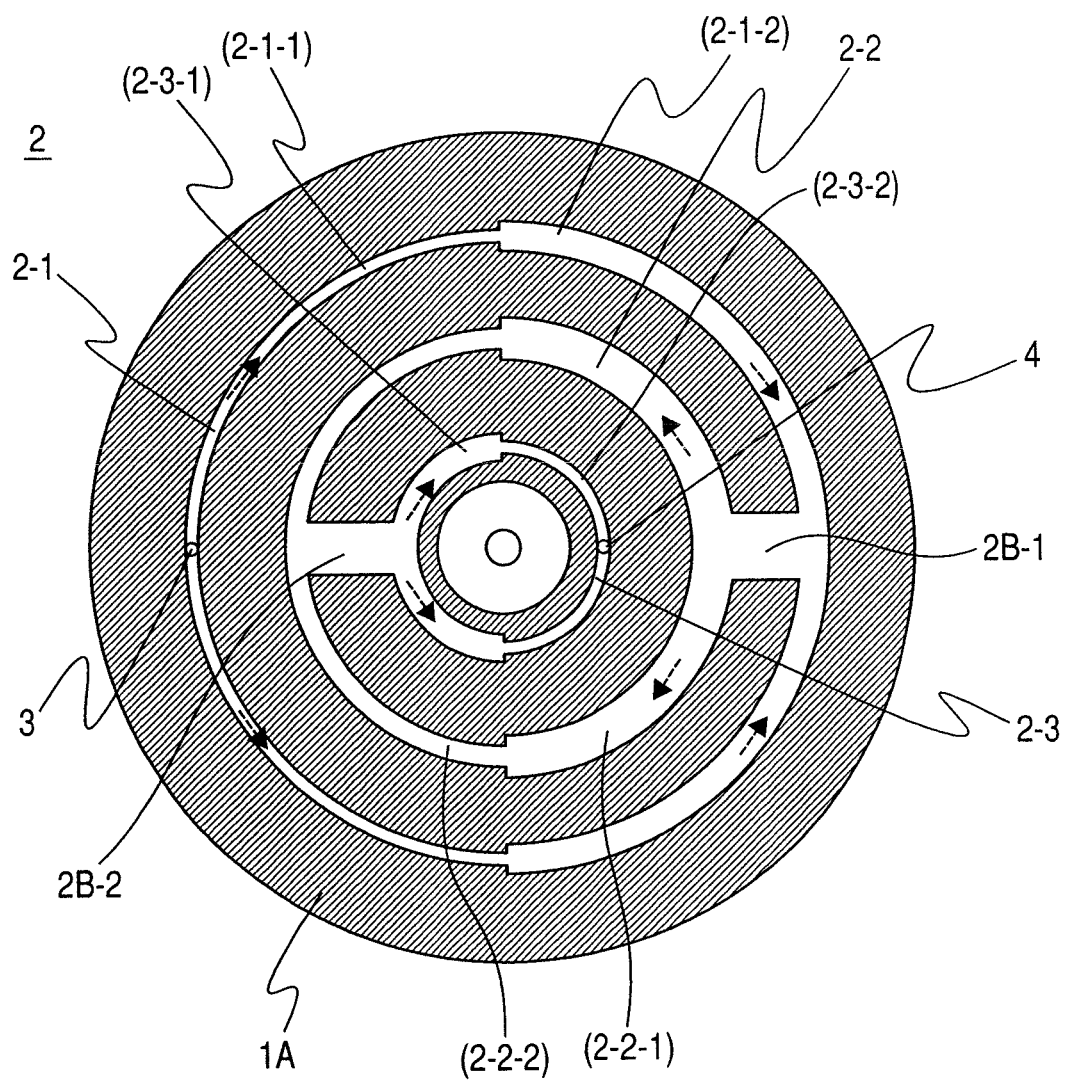
FIG. 6 is a schematic diagram showing a third example of the channel configuration in the sample stage according to the present invention.

There will be shown in FIG. 6 an example of another refrigerant channel structure 2 whose cross sections is changed in multiple steps through the refrigerant channel structure. The refrigerant channel structure 2 is structured in such a manner that the cross sections are enlarged/reduced in the respective channels (2-1, 2-2, 2-3) in multiple steps. Specifically, the cross section is changed in two steps of 2-1-1 and 2-1-2 in the channel (2-1), 2-2-1 and 2-2-2 in the channel (2-2), and 2-3-1 and 2-3-2 in the channel (2-3). Alternatively, the cross sections of the refrigerant channel structure may be configured to be continuously changed in the respective channels. Thereby, the changes of the heat transfer coefficient α of the refrigerant in each channel can be controlled, and a characteristic similar to the flat (optimized) characteristic shown by the solid line in FIG. 4B can be obtained, thus reducing a temperature difference of the wafer in the circumferential direction.

[Fifth Embodiment]

Figure 7:
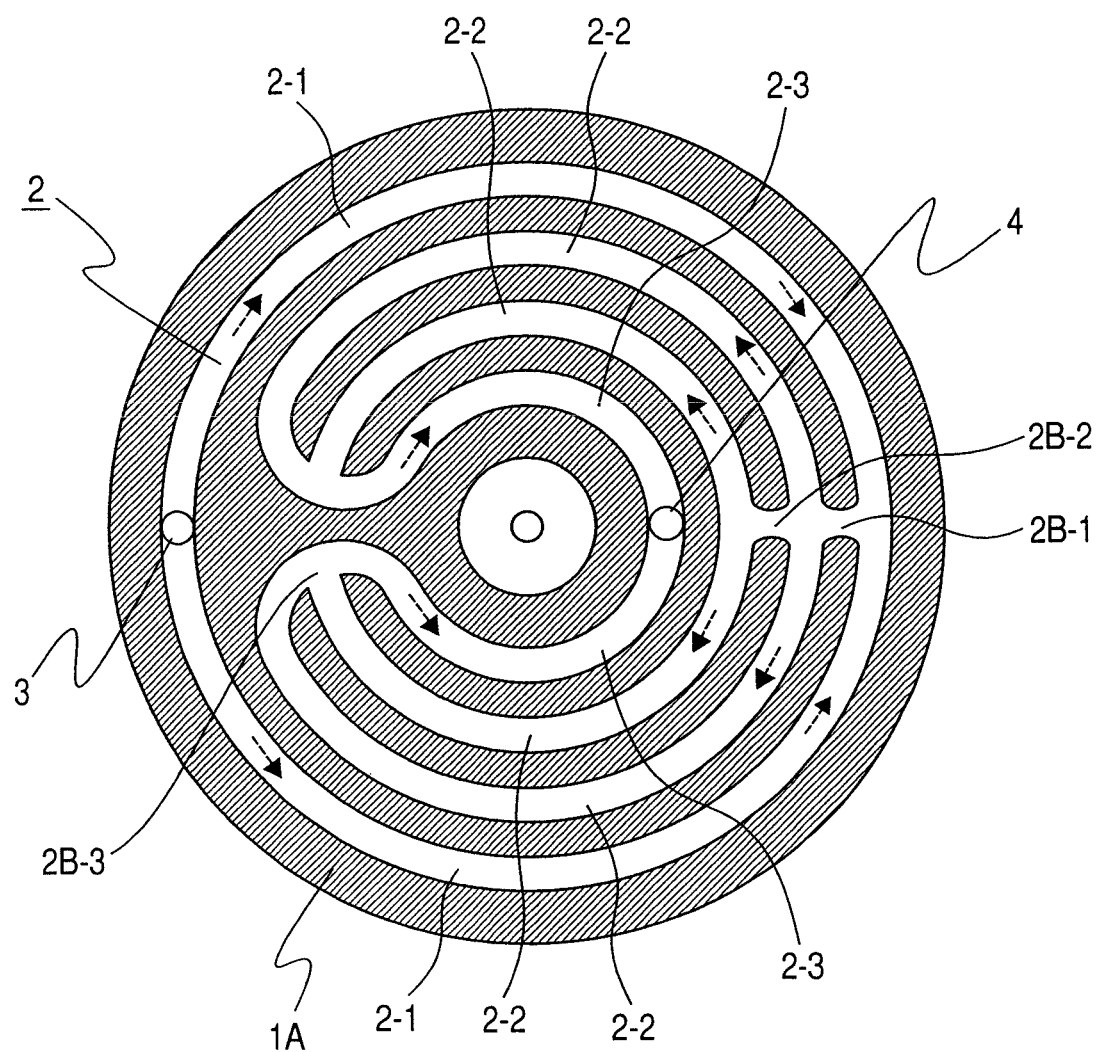
FIG. 7 is a schematic diagram showing a fourth example of the channel configuration in the sample stage according to the present invention.

As another embodiment of the present invention, there will be shown an example in FIG. 7 in which the cross sections of the refrigerant channel structure 2 are enlarged/reduced by the number of channels. With substantially the same cross section A of each channel, two channels 2-1 that are branched through the refrigerant supply port 3 are increased to four channels 2-2 through the linkage channels 2B-1 and 2B-2 at the dry degree area where the heat transfer coefficient α of the refrigerant becomes maximum. As a result, the cross sections of the refrigerant channel structure are increased, these four channels are converged to two channels 2-3 through the linkage channels 2B-3, and then the two refrigerant channels are connected to the refrigerant outlet port 4. Accordingly, the heat transfer coefficient α of the refrigerant at the dry degree area where the heat transfer coefficient α of the refrigerant becomes maximum is prevented from increasing and the heat transfer coefficient of the refrigerant is made substantially constant in the refrigerant channel structure 2, so that the in-plane temperature of the wafer on the sample stage 1 can be uniformly controlled.

[Sixth Embodiment]

Figure 8:
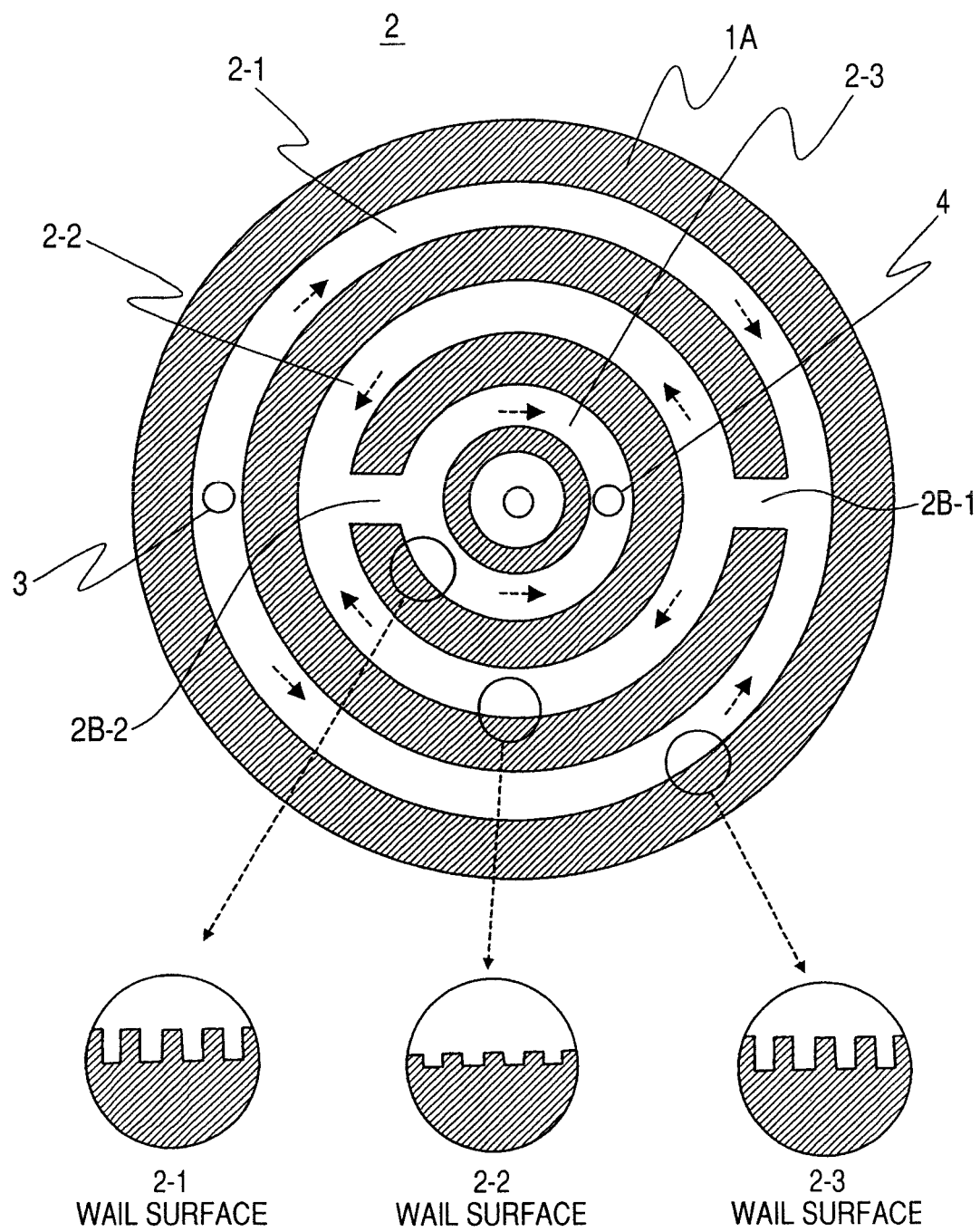
FIG. 8 is a schematic diagram showing a fifth example of the channel configuration in the sample stage according to the present invention.

There will be shown another embodiment in FIG. 8 in which the heat transfer coefficient in the channels is controlled by the shapes of inner walls of the refrigerant channel structure 2. The provision of an irregularity shape in the inner walls of the refrigerant channel structure 2 improves the agitation (convection) of the refrigerant and a heat transfer area, and thus the heat transfer coefficient α is increased. In view of this, the irregularities of the inner walls in the refrigerant channel structure 2 are lowered (may not be provided) at the dry degree area (2-2 in FIG. 8) where the heat transfer coefficient of the refrigerant is high so as to prevent the heat transfer coefficient from increasing, and the irregularities are heightened at the dry degree area (2-1 and 2-3 in FIG. 8) where the heat transfer coefficient of the refrigerant is low so as to increase the heat transfer coefficient. As a result, the heat transfer coefficient $\alpha$ can be kept constant in the refrigerant channel structure 2. It should be noted that if the ratio of the heights of the irregularities to the width (diameter) of the refrigerant channel is 2% or more, the improvement of the heat transfer coefficient can be realized. Excessively-high irregularities involve a problem of pressure loss, so that it is desirable that the ratio of the heights of the irregularities to the width (diameter) of the refrigerant channel is 2 to 10%. Further, if the irregularities are obliquely provided with respect to the refrigerant traveling direction, the heat transfer coefficient can be improved while suppressing the pressure loss.

[Seventh Embodiment]

In the calculation example of the present invention shown above, the heat transfer coefficient $\alpha$ of the refrigerant becomes maximum at a dry degree of approximately 0.5. However, in the actual condition, the dry degree X at which the heat transfer coefficient becomes maximum is changed depending on the type of the refrigerant to be used, the inner wall shapes of the refrigerant channel structure, or the flow volume of the refrigerant.

For example, if the occurrence of the dry out can be prevented by optimizing the irregularities in the refrigerant channel structure, it is conceivable that the heat transfer coefficient becomes maximum within a range of 0.5 to 0.9 of the dry degree. In that case, the position where the channel cross section A of the refrigerant in FIGS. 2 to 6 of the present invention is enlarged to the maximum degree is adjusted to the dry degree area where the maximum heat transfer coefficient $\alpha$ of the refrigerant occurs. It is conceivable that where the heat transfer coefficient of the refrigerant becomes maximum is within a range of 0.5 to 0.9 of the dry degree as described above. Therefore, the position where the channel cross section of the refrigerant is enlarged to the maximum degree is present at a position (a position in the latter part) of one-half or more of the total channel length.

[Eighth Embodiment]

Figure 9:
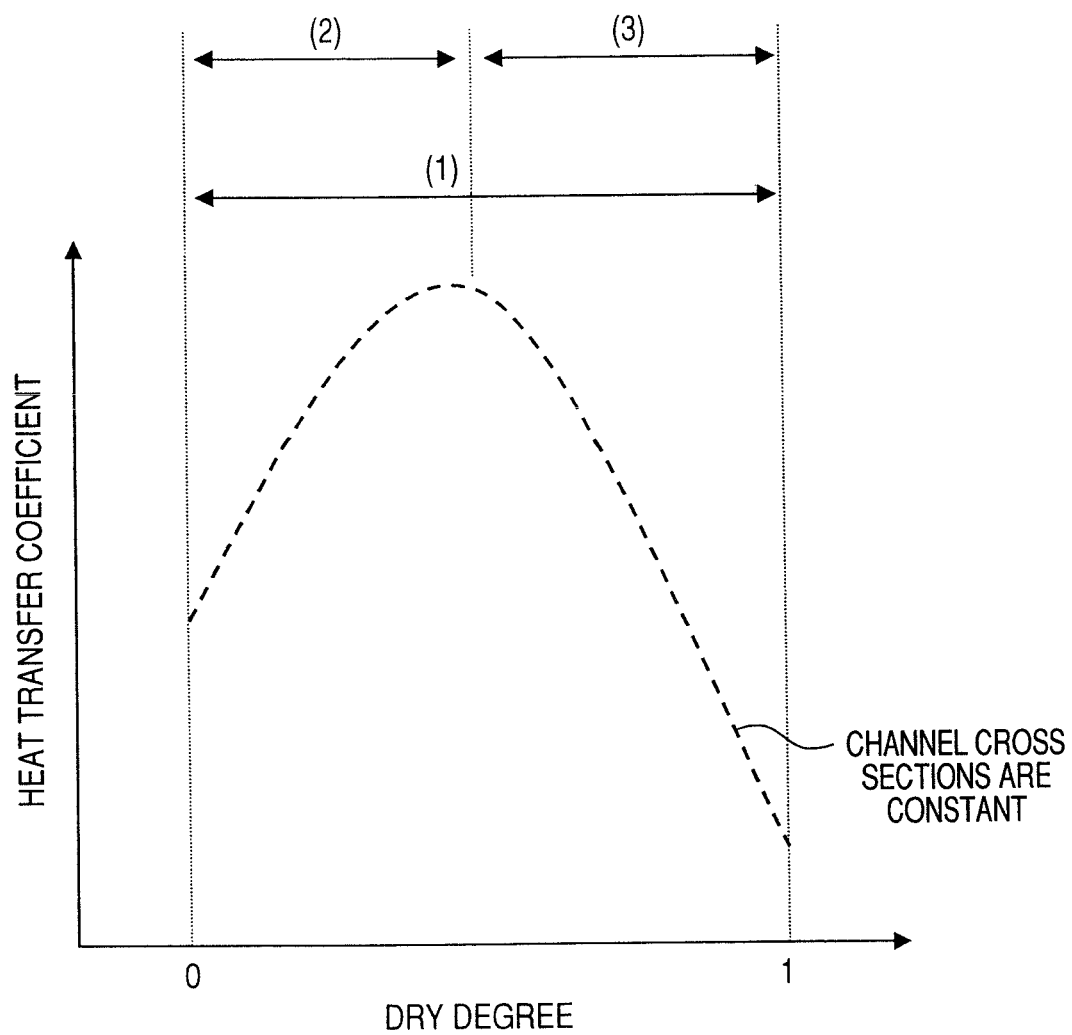
FIG. 9 is an explanation diagram showing another example of in-plane temperature control according to the present invention.

As another embodiment of the present invention, there will be shown an example in FIG. 9 in which the in-plane temperature of the wafer is controlled by utilizing the changes of the heat transfer coefficient in the direct-expansion-system refrigeration cycle. In a typical direct-expansion-system refrigeration cycle, a refrigerant amount Q corresponding to a heat input to the wafer is supplied to the refrigerant channel structure in the sample stage. Thereby, the refrigerant is completely evaporated in the sample stage from a liquid phase to a gaseous phase (the dry degree X=0→1) as in the area (1) in FIG. 9.

On the contrary, if the refrigerant is excessively supplied with respect to a heat input to the wafer, the refrigerant is evacuated from the sample stage without being completely evaporated, and thus the distribution of the heat transfer coefficient in the refrigerant channel structure is represented as the area (2). In the area (2), the refrigerant is evacuated from the sample stage at a dry degree of approximately 0.5. Accordingly, the distribution of the heat transfer coefficient in the refrigerant channel structure changed from the area (1) to the area (2), and the heat transfer coefficient $\alpha$ of the refrigerant in the latter part of the refrigerant channel structure is increased. The use of the function enables the control of in-plane temperature distribution of the wafer.

If the dry degree X of the refrigerant can be increased (increased to X=approximately 0.5 in the area (3)) in advance before supplying to the sample stage as in the area (3) in FIG. 9, the heat transfer coefficient $\alpha$ of the refrigerant in the former part of the refrigerant channel structure 2 is increased, which also enables the control of in-plane temperature distribution of the wafer. In the case where the distribution control of the area (2) is performed, it is only necessary to control the rotational speed of the compressor in the direct-expansion-system refrigeration cycle.

Further, in the case of the distribution control of the area (3), a refrigerant vaporization means (a first refrigerant evaporator) 10 such as a heater is installed in the refrigeration cycle in front of the refrigerant channel structure (a second refrigerant evaporator) 2 in the sample stage so as to control the dry degree X. It is advantageous that the whole increase of the heat transfer coefficient of the refrigerant caused by increasing the flow volume of the refrigerant is handled by increasing the pressure (the refrigerant evaporation temperature) of the refrigerant and by suppressing the cooling capability.

Further, if the control of the area (2) and the area (3) is possible, the in-plane temperature distribution of the wafer may be uniformed by such the following method.

By combining the control of the area (2) with the structure in which the cross sections of the refrigerant channel structure 2 in the sample stage are continuously enlarged from the refrigerant supply port to the refrigerant outlet port, an increase of the heat transfer coefficient $\alpha$ of the refrigerant that is a characteristic represented by an upward line is suppressed within a range of 0 to approximately 0.5 of the dry degree X, and the in-plane temperature distribution of the wafer can be uniformed.

Further, by combining the control of the area (3) with the structure in which the cross sections of the refrigerant channel structure 2 in the sample stage are continuously reduced from the refrigerant supply port to the refrigerant outlet port, a decrease of the heat transfer coefficient $\alpha$ of the refrigerant that is a characteristic represented by a downward line is suppressed within a range of approximately 0.5 to 1 of the dry degree X, and the in-plane temperature distribution of the wafer can be uniformed.

In the case where the refrigerant passes through the refrigerant channel structure 2 without being completely evaporated, the refrigerant that remains in a liquid state flows in the compressor as it is, which possibly results in damage of the compressor. In that case, it is necessary to install a carburetor by which the refrigerant is completely evaporated in the channel immediately before the compressor. As an example of the carburetor, a suction tank can be given.

[Ninth Embodiment]

There will be shown the whole system configuration of a plasma processing apparatus that is another embodiment of the present invention. In the plasma processing apparatus of the embodiment, heater layers 13 are provided in a dielectric film of the lower electrode (electrostatic absorption electrode) 1B, in addition to the configuration of the embodiment in FIG. 1. The heater layers 13 are separately formed in three areas, for example, in the center portion of the lower electrode 1B in a disk shape, in the outer circumferential portion of a ring shape, and in the middle portion located between these two portions.

The temperature of the wafer W is changed depending on a processing condition such as plasma etch, that is, a condition of a heat input to the wafer X from plasma, output of each heater area, and a cooling condition by a refrigerant in the refrigerant channel structure 2. Each temperature sensor is provided in three areas of the heater layers 13, and together with the flow volume of the refrigerant that flows in the channels 2 of the refrigeration cycle, electric power supplied from a heater power source 14 to the respective heater areas is controlled by the temperature control system 101.

Figure 10:
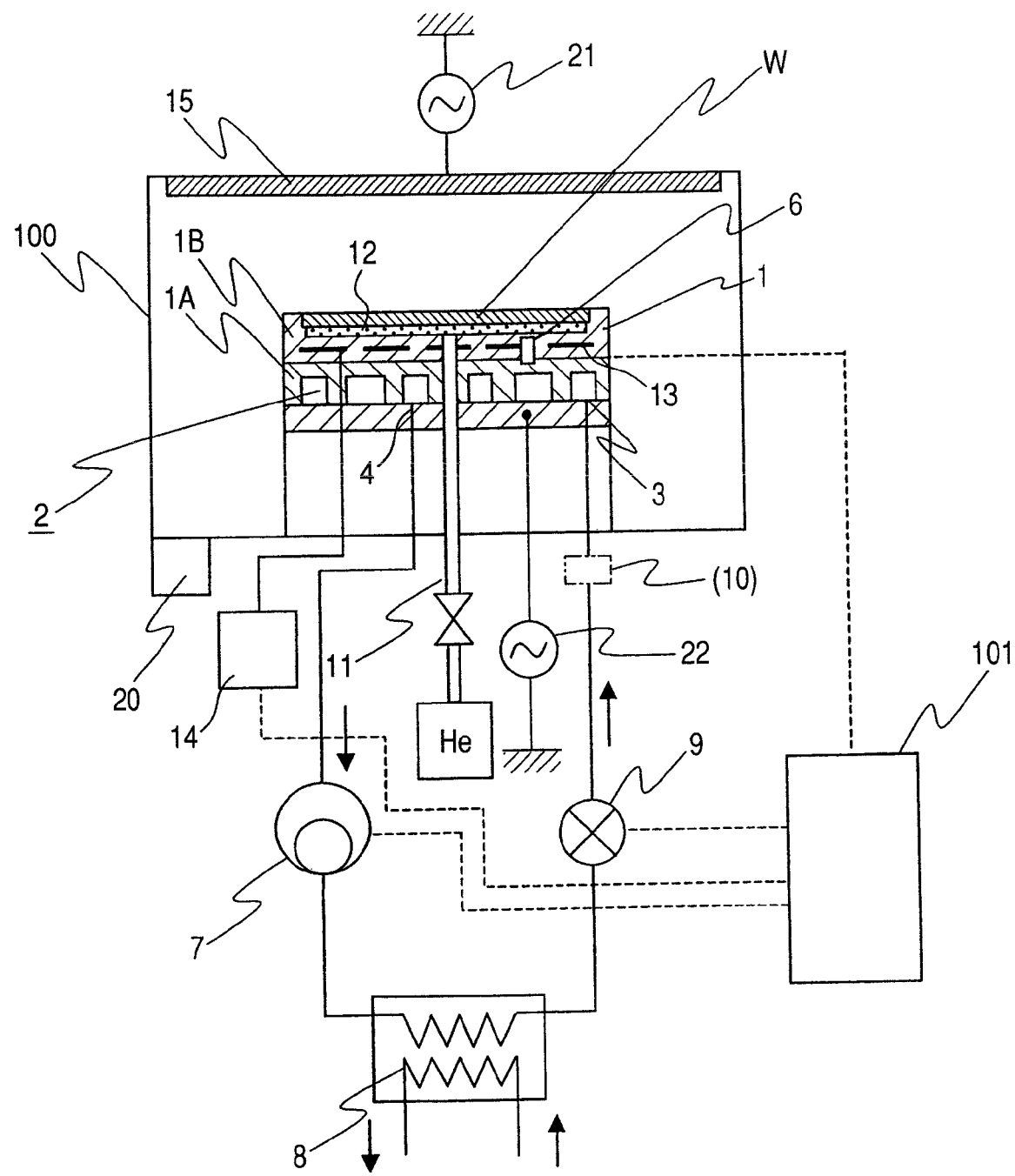
FIG. 10 is a schematic diagram showing another embodiment of a plasma processing apparatus according to the present invention.

Next, there will be given a brief explanation of operations of the apparatus in FIG. 10. First, the wafer W is carried in the processing chamber 100, and placed and fixed on the sample stage 1. Then, a process gas is supplied, and the processing chamber 100 is adjusted to a predetermined processing pressure. Next, plasma is generated by power source supply from the antenna power source 21 and the bias power source 22 and by the act of the magnetic field forming means (not shown), and an etching process using the plasma is performed. A wafer temperature during the process is feedback-controlled by the temperature control system 101 while monitoring temperature information from the temperature sensors 6. Further, a wafer temperature is controlled by adjusting the compressor 7, the expansion valve 9 and the heater power source 14 and by adjusting the flow volume of the refrigerant, the evaporation temperature, the thermal dose in each area of the heater layers 13.

At this time, since the refrigerant channel structure 2 in the sample stage 1 has a structure in which the channel cross sections are changed in accordance with changes of the heat transfer coefficient of the refrigerant, the in-plane distribution of cooling capability caused by the phase change of the refrigerant is reduced and the in-plane temperature of the sample can be uniformly controlled at high speed.

Further, by employing the following method described in FIG. 9 together therewith, the in-plane temperature distribution of the wafer can be arbitrarily controlled.

(1) The refrigerant is excessively (more than the amount of a heat input) supplied to the refrigerant channel structure 2 by the compressor 7. Alternatively, the refrigerant amount may be controlled on the insufficient side in consideration of the upper limit of the temperature rise of the wafer W.

(2) A dry degree adjusting means (a first refrigerant evaporator) 10 is installed between the sample stage 1 and the expansion valve 9 to adjust the dry degree of the refrigerant supplied to the refrigerant channel structure 2 (a second refrigerant evaporator) 2 in the sample stage 1.

By employing these configurations and the control methods, high-accuracy processing in the whole in-plane of the wafer W is possible even in the high heat input etching condition in which high wafer bias electric power is applied.

The etching is completed through such processes, and the supplying of the electric power, magnetic fields, and process gas is stopped.

It is obvious that the present invention is effective even if the plasma generating means employs any one of the following methods: a method in which high frequency electric power that is different from that applied to the wafer W is applied to the electrode arranged opposed to the wafer W; an inductive coupling method; an interaction method between magnetic fields and high frequency electric power; and a method in which high frequency electric power is applied to the sample stage 1.

In response to a processing condition in which a high heat input occurs in such a manner that a high frequency electric power of 3 W/cm$^2$ or more is applied to the wafer W, the present invention is effective even when deep hole processing with a high aspect ratio of 15 or more is performed. It is assumed that a thin film on which plasma processing is performed is a single film that is mainly composed of any kind selected from $SiO_2$, $Si_3N_4$, SiOC, SiOCH, and SiC, or a multilayer film that is composed of the film kinds of two or more.

[Tenth Embodiment]

Figure 11:
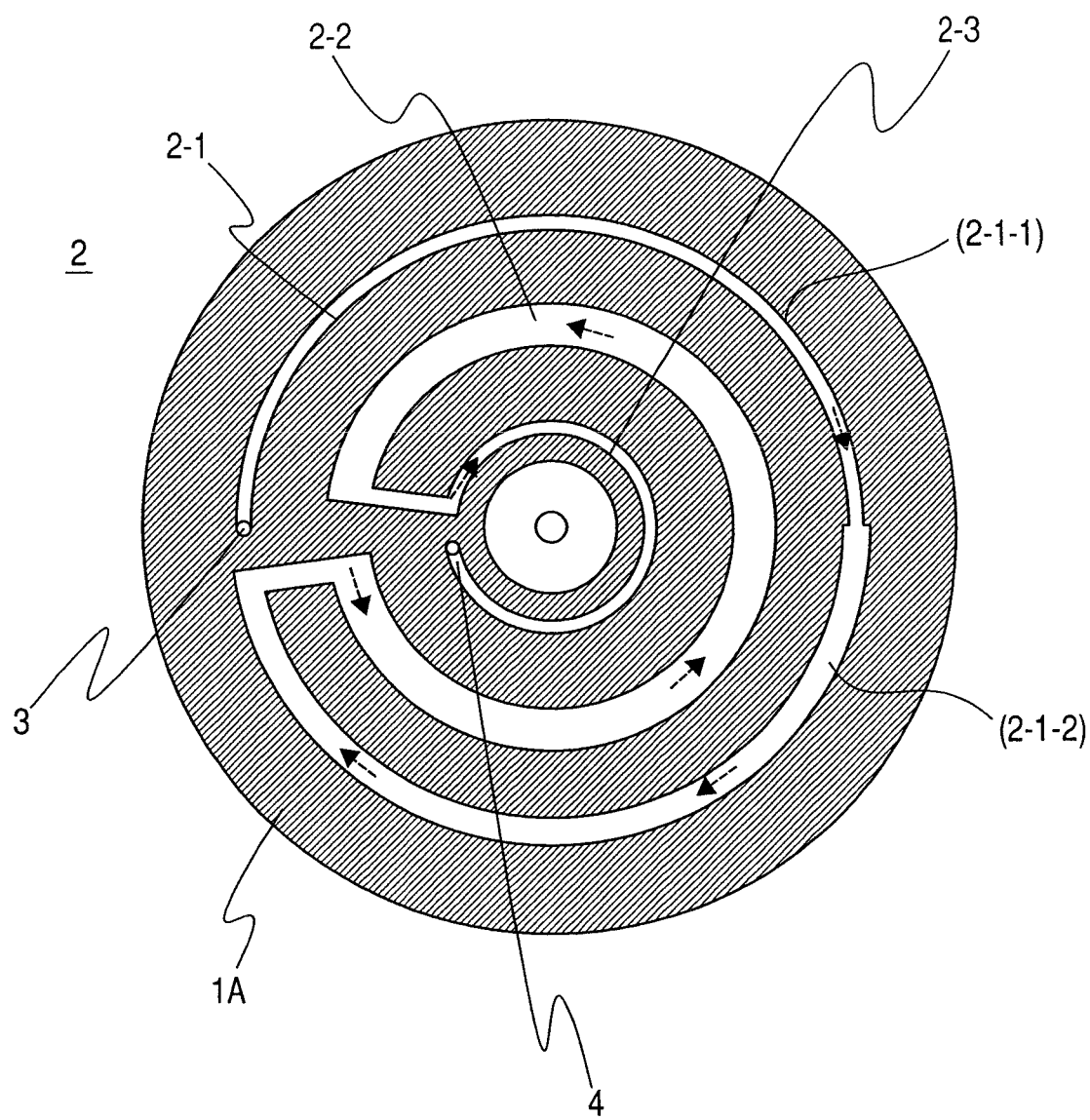
FIG. 11 is a schematic diagram showing a sixth example of the channel configuration in the sample stage according to the present invention.

As another embodiment of the refrigerant channel structure 2 configuring the evaporator, there will be shown an example in FIG. 11 in which the refrigerant channel is a single, continuous channel and the cross section in the channel is enlarged and reduced. Namely, the refrigerant channel structure 2 includes a first channel 2-1 (2-1-1, 2-1-2) which is connected to the refrigerant supply port 3 and whose cross section is enlarged in two steps, a second channel 2-2 whose cross section is enlarged compared to the first channel, and the third channel 2-3 whose cross section is reduced compared to the second channel, and the third channel 2-3 is connected to the refrigerant outlet port 4. Since the refrigerant channel structure 2 is a single channel, continuous channel, a risk that the refrigerant is not uniformly branched at the branch portion for the refrigerant to generate a difference in in-plane temperature can be reduced. Since latent heat generated by refrigerant evaporation is utilized in the direct-expansion-system refrigeration cycle, the cooling capability per unit flow volume is high and the flow volume of the refrigerant is small compared to a conventional liquid refrigerant method and the like. Therefore, in the case where the branch portion for the refrigerant is provided in the refrigerant channel structure 2, it is advantageous that the number of branches is suppressed to 2 to 4 for one channel. For the larger number of branches, it is desirable to install a distributor for refrigerant.

[Eleventh Embodiment]

Figure 12:
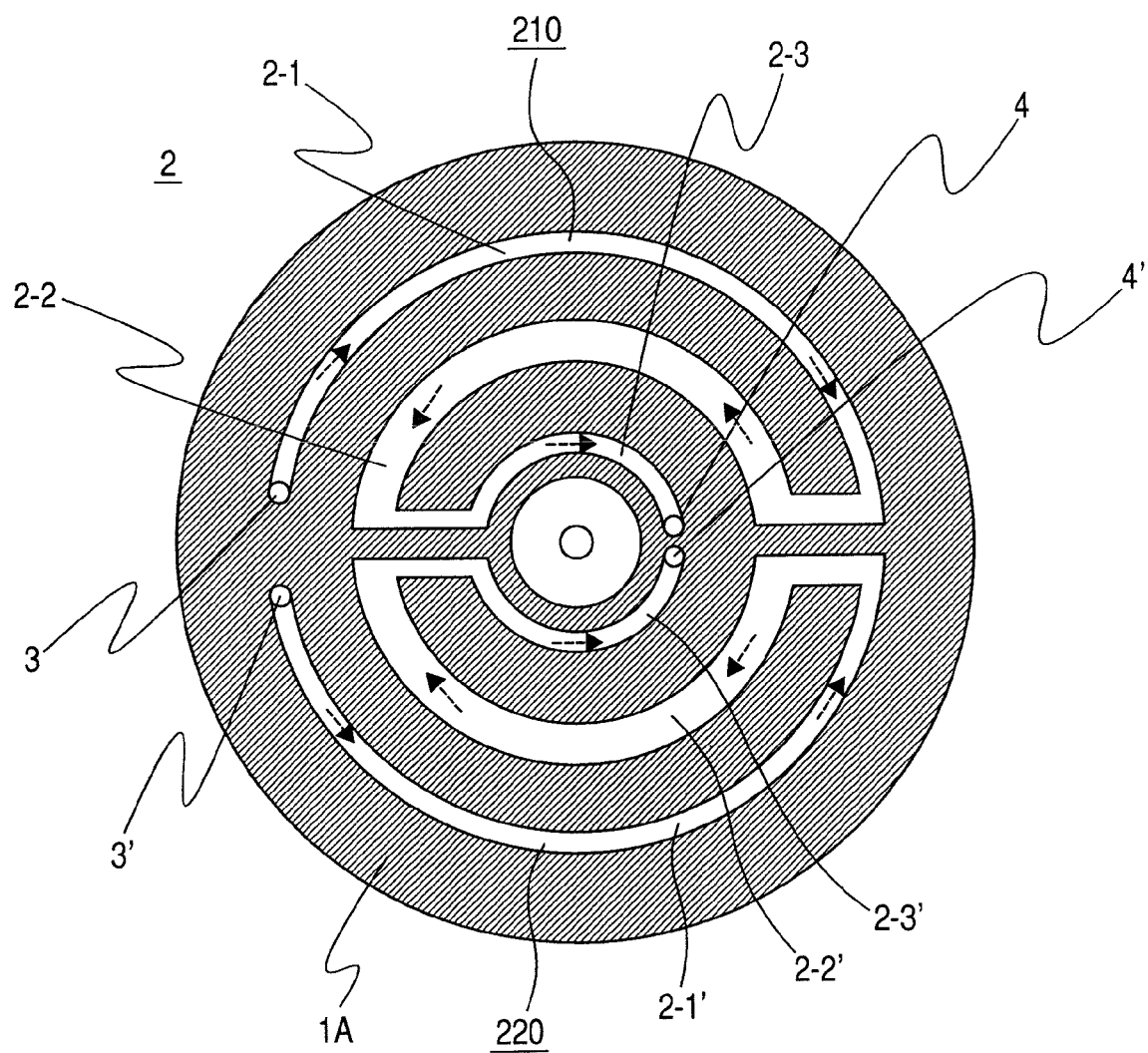
FIG. 12 is a schematic diagram showing a seventh example of the channel configuration in the sample stage according to the present invention.

As another embodiment of the refrigerant channel structure 2 configuring the evaporator, there will be shown an example in FIG. 12 in which the refrigerant channel structure has two refrigerant channel units (210, 220) each of which is a single channel, continuous channel, the cross section in the channel is enlarged and reduced, and the channel is provided in a diversified manner. Each of the refrigerant channel units (210, 220) includes first channels 2-1, 2-1' which are connected to two refrigerant supply ports 3, 3', second channels 2-2, 2-2' whose cross sections are enlarged, and third channels 2-3, 2-3' whose cross sections are reduced, and two third channels are connected to two refrigerant outlet ports 4, 4'. In the sample stage 1, refrigerant supply ports 3, 3' are connected to a common inlet passage (not shown) connected to an expansion valve (or a refrigerant vaporization means) and refrigerant outlet ports 4 and 4' are connected to a common exit passage (not shown) connected to a compressor of the refrigeration cycle, respectively.

Since each of the refrigerant channel units (210, 220) is structured in an independent manner, it is also possible to arbitrarily control the in-plane temperature distribution of the wafer on the sample stage 1 by separately controlling the pressure (refrigerant evaporation temperature) of the refrigerant in each channel.

Although the example of FIG. 12 shows a refrigerant channel structure 2 comprising two refrigerant channel units, by employing a configuration in which the independent refrigerant channel units are further diversified, for example, a surface corresponding to the sample placement surface of the sample stage 1 is divided into three or four, and the cross section of the single, continuous refrigerant channel unit is changed in mid-course in each divided in-plane as the respective above-described embodiments, the in-plane temperature distribution of the wafer may be precisely controlled.

The temperature adjusting unit in the plasma processing apparatus proposed in the present invention is not limited to the above-described embodiments, but can be applied to an apparatus that requires the high-speed, uniform in-plane temperature control of the wafer to be processed, such as an ashing apparatus, a sputtering apparatus, an ion implantation apparatus, a resist applying apparatus, and a plasma CVD apparatus.

What is claimed is:

1. A plasma processing apparatus which generates a plasma using a process gas introduced inside a vacuum processing chamber, and which processes a surface of a sample to be processed on a sample placement surface of a sample stage disposed inside the vacuum processing chamber, the apparatus comprising:
    a refrigerant channel circularly disposed in the sample stage under the sample placement surface, and a refrigerant supply port and a refrigerant outlet port which communicate with the refrigerant channel and are located in the sample stage, with the refrigerant flowing into the refrigerant channel through the refrigerant supply port and flowing out of the refrigerant channel through the refrigerant outlet port;
    a refrigeration cycle comprising the refrigerant channel in the sample stage, a compressor, a condenser and an expansion valve which are connected in this order, the refrigerant channel operating as an evaporator;
    a carburetor provided between the inlet of the compressor and the refrigerant outlet port on the refrigeration cycle which completely evaporates the refrigerant from the refrigerant outlet port which communicates with the refrigerant channel; and
    a controller which controls the operation of the refrigeration cycle,
    wherein the refrigerant channel has at least one of a portion in which the cross section area of the refrigerant channel is increasing, a portion in which the cross section area of the refrigerant channel is decreasing, and a portion in which the cross section area of the refrigerant channel is increasing and thereafter decreasing, and the refrigerant flows through said at least one of a portion in which the cross section area of the refrigerant channel is increasing, a portion in which the cross section area of the refrigerant channel is decreasing, and a portion in which the cross section area of the refrigerant channel is increasing and thereafter decreasing, with changing a rate of gas and liquid of the refrigerant; and
    wherein the controller adjusts the operation of the refrigeration cycle so that the refrigerant in the refrigerant channel is kept in a gas-liquid two-phase state of the refrigerant, and adjusts the dry degree of the refrigerant in the gas-liquid two-phase state inside the refrigerant channel by controlling an operation of the compressor, so that a heat transfer coefficient of the refrigerant is at its maximum at a position of the refrigerant channel where a cross section area of the refrigerant channel is at its maximum.

2. A plasma processing apparatus according to claim 1, the apparatus further comprising a heater disposed in front of the refrigerant supply port in the sample stage in the refrigeration cycle, the heater being configured to be capable of evaporating the liquid-state refrigerant; and
    wherein the controller adjusts at least one of the refrigerant flow rate, the refrigerant pressure and the operation of the heater in the refrigeration cycle so that a heat transfer coefficient of the refrigerant is at its maximum at the position of the refrigerant channel where a cross section area of the refrigerant channel is at its maximum.

3. A plasma processing apparatus according to claim 2, wherein the controller adjusts the operation of the refrigeration cycle so that the refrigerant in the refrigerant channel is kept in the two-phase state of the refrigerant.

4. A plasma processing apparatus according to claim 1, wherein said refrigerant channel is a single channel having said at least one of said portion in which the cross section area of the refrigerant channel is increasing, said portion in which the cross section area of the refrigerant channel is decreasing, and said portion in which the cross section area of the refrigerant channel is increasing and thereafter decreasing.

5. A plasma processing method according to claim 1, wherein the refrigerant channel, disposed in the sample stage, is configured such that when the refrigerant flows through the refrigerant channel a temperature of the sample to be processed is controlled.

* * * * *